(12) United States Patent
Hashemi et al.

(10) Patent No.: US 11,844,284 B2
(45) Date of Patent: Dec. 12, 2023

(54) ON-CHIP INTEGRATION OF A HIGH-EFFICIENCY AND A HIGH-RETENTION INVERTED WIDE-BASE DOUBLE MAGNETIC TUNNEL JUNCTION DEVICE

(71) Applicant: International Business Machines Corporation, Armonk, NY (US)

(72) Inventors: Pouya Hashemi, Purchase, NY (US); Chandrasekharan Kothandaraman, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 428 days.

(21) Appl. No.: 17/304,991

(22) Filed: Jun. 29, 2021

(65) Prior Publication Data
US 2022/0416156 A1 Dec. 29, 2022

(51) Int. Cl.
*H10N 50/01* (2023.01)
*H10B 61/00* (2023.01)
(Continued)

(52) U.S. Cl.
CPC ............ *H10N 50/01* (2023.02); *H10B 61/00* (2023.02); *H10N 50/10* (2023.02); *H10N 50/80* (2023.02); *H10N 50/85* (2023.02); *H10N 59/00* (2023.02)

(58) Field of Classification Search
CPC ........ H10N 50/01; H10N 50/80; H10N 59/00; H10N 50/85; H10N 50/10; H10B 61/00
(Continued)

(56) References Cited

U.S. PATENT DOCUMENTS 10,381,060 B2    8/2019   Kan
2015/0033854 A1*  2/2015   Zhang ................ G01C 19/5712
                                                         73/504.12
(Continued)

OTHER PUBLICATIONS

Patent Cooperation Treaty International Searching Authority, Notification of Transmittal of the International Search Report and the Written Opinion of the International Searching Authority, or the declaration, International application No. PCT/EP2022/063819, dated Oct. 21, 2022, 15 pages.

(Continued)

*Primary Examiner* — Jami Valentine Miller
(74) *Attorney, Agent, or Firm* — Mark Bergner (57) ABSTRACT

A method of manufacturing and resultant device are directed to an inverted wide-base double magnetic tunnel junction device having both high-efficiency and high-retention arrays. The method includes a method of manufacturing, on a common stack, a high-efficiency array and a high-retention array for an inverted wide-base double magnetic tunnel junction device. The method comprises, for the high-efficiency array and the high-retention array, forming a first magnetic tunnel junction stack (MTJ2), forming a spin conducting layer on the MTJ2, and forming a second magnetic tunnel junction stack (MTJ1) on the spin conducting layer. The first magnetic tunnel junction stack for the high-retention array has a high-retention critical dimension (CD) (HRCD) that is larger than a high-efficiency CD (HECD) of the first magnetic tunnel junction stack for the high-efficiency array. The second magnetic tunnel junction stack (MTJ1) is shorted for the high-retention array and is not shorted for the high-efficiency array.

20 Claims, 10 Drawing Sheets

(51) Int. Cl.
  *H10N 59/00* (2023.01)
  *H10N 50/10* (2023.01)
  *H10N 50/80* (2023.01)
  *H10N 50/85* (2023.01)
(58) Field of Classification Search
  USPC .......................................................... 257/421
  See application file for complete search history.

(56) References Cited

U.S. PATENT DOCUMENTS

| | | |
|---|---|---|
| 2016/0020250 A1 | 1/2016 | Li |
| 2016/0072050 A1 | 3/2016 | Yoshikawa |
| 2016/0181508 A1 | 6/2016 | Lee |
| 2017/0092852 A1* | 3/2017 | Son .................. H10N 50/01 |
| 2018/0269383 A1 | 9/2018 | Briggs |
| 2020/0144488 A1 | 5/2020 | Sundar |
| 2020/0273510 A1* | 8/2020 | Mihajlovic ............ H10B 61/00 |
| 2021/0135090 A1 | 5/2021 | Sun |
| 2021/0288246 A1* | 9/2021 | Hashemi ................ H10N 50/10 |
| 2023/0329789 A1* | 10/2023 | Roh ....................... A61B 34/10 |
| | | 604/506 |

OTHER PUBLICATIONS

K. Kwon, X. Fong, P. Wijesinghe, P. Panda and K. Roy, "High-Density and Robust STT-MRAM Array Through Device/Circuit/Architecture Interactions," in IEEE Transactions on Nanotechnology, vol. 14, No. 6, pp. 1024-1034, Nov. 2015, doi: 10.1109/TNANO.2015.2456510, https://ieeexplore.ieee.org/abstract/document/7159082.

Pouya Hashemi et al, "Double Magnetic Tunnel Junction Device," U.S. Appl. No. 17/128,330, filed Dec. 21, 2020.

Pouya Hashemi et al, "Inverted Wide Base Double Magnetic Tunnel Junction Device," U.S. Appl. No. 16/817,744, filed Mar. 13, 2020.

* cited by examiner

ON-CHIP INTEGRATION OF A HIGH-EFFICIENCY AND A HIGH-RETENTION INVERTED WIDE-BASE DOUBLE MAGNETIC TUNNEL JUNCTION DEVICE

BACKGROUND

The present disclosure relates to magnetic a tunnel junction ("MTJ") device and method of manufacturing an MTJ device. Specifically, the present disclosure relates to an inverted wide-base double MTJ device that contains both high-efficiency and high-retention components.

SUMMARY

Embodiments of the present disclosure relate to a method of manufacturing an inverted wide-base double magnetic tunnel junction device having both high-efficiency and high-retention arrays. The method includes a method of manufacturing, on a common stack, a high-efficiency array and a high-retention array for an inverted wide-base double magnetic tunnel junction device. The method comprises, for the high-efficiency array and the high-retention array, forming a first magnetic tunnel junction stack (MTJ2), forming a spin conducting layer on the MTJ2, and forming a second magnetic tunnel junction stack (MTJ1) on the spin conducting layer. The first magnetic tunnel junction stack for the high-retention array has a high-retention critical dimension (CD) (HRCD) that is larger than a high-efficiency CD (HECD) of the first magnetic tunnel junction stack for the high-efficiency array. The second magnetic tunnel junction stack (MTJ1) is shorted for the high-retention array and is not shorted for the high-efficiency array.

Other embodiments relate to an inverted wide-base double magnetic tunnel junction device having both high-efficiency and high-retention arrays. The device includes a magnetic tunnel junction device, comprising, on a common base, a high-efficiency array, comprising a first magnetic tunnel junction stack (MTJ2), a spin conducting layer on the MTJ2, and a second magnetic tunnel junction stack (MTJ1) on the spin conducting layer, and a high-retention array comprising a first magnetic tunnel junction stack MTJ2. The device further comprises a spin conducting layer on the MTJ2, and a second magnetic tunnel junction stack MTJ1 on the spin conducting layer. The first magnetic tunnel junction stack for the high-retention array has a high-retention critical dimension (CD) (HRCD) that is larger than a high-efficiency CD (HECD) of the first magnetic tunnel junction stack for the high-efficiency array. The second magnetic tunnel junction stack (MTJ1) is shorted for the high-retention array and is not shorted for the high-efficiency array.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

The present disclosure describes double magnetic tunnel junction ("DMTJ") devices and methods of manufacturing DMTJ devices. In particular, the present disclosure describes an inverted wide-base double MTJ device that contains both high-speed and high-retention components.

Various embodiments of the present disclosure are described herein with reference to the related drawings. Alternative embodiments can be devised without departing from the scope of the present disclosure. Various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

"Unless otherwise noted, ranges (e.g., time, concentration, temperature, etc.) indicated herein include both endpoints and all numbers between the endpoints. Unless specified otherwise, the use of "about," "approximately," or a tilde (~) in connection with a range applies to both ends of the range (e.g., "approximately 1 g-5 g" should be interpreted as "approximately 1 g-approximately 5 g") and, in connection with a list of ranges, applies to each range in the list (e.g., "about 1 g-5 g, 5 g-10 g, etc." should be interpreted as "about 1 g-about 5 g, about 5 g-about 10 g, etc."). Unless otherwise indicated, modifying terms such as "about," "approximately," and "~" indicate ±10% of a recited value, range of values, or endpoints of one or more ranges of values."

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. The term "selective to," such as, for example, "a first element selective to a second element," means that a first element can be etched, and the second element can act as an etch stop.

For the sake of brevity, conventional techniques related to semiconductor device and integrated circuit ("IC") fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition ("PVD"), chemical vapor deposition ("CVD"), electrochemical deposition ("ECD"), molecular beam epitaxy ("MBE") and more recently, atomic layer deposition ("ALD") among others. Another deposition technology is plasma enhanced chemical vapor deposition ("PECVD"), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization ("CMP"), and the like. One example of a removal process is ion beam etching ("IBE"). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching ("RIE"). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, embedded DRAM ("eDRAM") is a dynamic random-access memory ("DRAM") integrated on the same die or multi-chip module ("MCM") of an application-specific integrated circuit ("ASIC") or microprocessor. eDRAM has been implemented in silicon-on-insulator ("SOP") technology, which refers to the use of a layered silicon-insulator-silicon substrate in place of conventional silicon substrates in semiconductor manufacturing. eDRAM technology has met with varying degrees of success, and demand for SOI technology as a server memory option has decreased in recent years.

Magnetoresistive random-access memory ("MRAM") devices using magnetic tunnel junctions ("MTJ") are one option to replace existing eDRAM technologies. MRAM is a non-volatile memory, and this benefit is a driving factor that is accelerating the development of this memory technology. Current MRAM MTJ structures are relatively slow, and the only way to reach MTJ write target speeds comparable to eDRAM (~5 ns) are with double magnetic tunnel junctions ("DMTJ"). DMTJ devices reduce the write current by factor of two.

In certain DMTJ devices, a wide non-magnetic base modified DMTJ device is used to increase the MTJ's switching efficiency by eliminating both the resistance area ("RA") penalty and magnetoresistance ("MR") penalty that are both associated with standard DMTJs that have top and bottom MTJs with similar critical-dimensions ("CD"). These types of wide based devices provide double spin-current sourcing ("DSTT") benefits. Also, for these types of devices, the bottom barrier layer can have a relatively high RA. These devices leverage spin-diffusion transport in the non-magnetic ("NM") metal layer and can a achieve a reduction in the charge current density through the bottom MgO layer. The bottom NM layer may also serve as an additional boron drain conduit during the annealing processes. In certain of these devices, a non-magnetic spin conductor is used between the two MTJ stacks (e.g., Cu, CuN, Cu$_3$N, CuN/Cu/CuN, CuN/Cu(100)Ag, AgSn etc.). During the manufacture of these devices, an in-situ stack deposition process is desired for stack integrity and to avoid an unexpected loss of spin conductance which may happen in an ex-situ process such as oxidation or CMP. However, with these wide based DMTJ devices, there is a need to harness a stop-etch on a, for example, Ag type of NM layer. There is also a need to control the body-centered cubic (e.g., CoFe) nucleation front.

The descriptions of the various embodiments of the present invention are presented for purposes of illustration, but are not intended to be exhaustive or limited to the embodiments disclosed. Many modifications and variations will be apparent to those of ordinary skill in the art without departing from the scope and spirit of the described embodiments. The terminology used herein has been chosen to best explain the principles of the embodiments, the practical application or technical improvement over technologies found in the marketplace, or to enable others of ordinary skill in the art to understand the embodiments disclosed herein.

The following acronyms may be used below:

TABLE 1

| | |
|---|---|
| ALD | atomic layer deposition |
| BEOL | back end of line |
| CD | critical dimension |
| CMP | chemical-mechanical planarization |
| CVD | chemical vapor deposition |
| DMTJ | double MTJ |

TABLE 1-continued

| | |
|---|---|
| ECD | electrochemical deposition |
| HM | hard mask |
| HECD | high-efficiency critical dimension |
| HRCD | high-retention critical dimension |
| IBE | ion beam etching |
| IC | integrated circuit |
| ILD | interlayer dielectric |
| MBE | molecular beam epitaxy |
| MDMTJ | modified DMTJ |
| MR | magnetoresistance |
| MRAM | magnetoresistive random access memory |
| MTJ | magnetic tunnel junction |
| PECVD | plasma enhanced chemical vapor deposition |
| PMA | perpendicular magnetic anisotropy |
| PVD | physical vapor deposition |
| RA | resistance area |
| RIE | reactive ion etching |
| RTA | rapid thermal annealing |
| SHM | sacrificial hard mask |
| STT | spin transfer torque |
| TMR | tunneling magneto resistance |

Acronyms

The general concept of a wide non-magnetic base modified double MTJ (mDMTJ) is known to increase an MTJ's switching efficiency by eliminating both the resistance area (RA) and magnetoresistance (MR) penalties of standard double MTJs with similar critical dimensions (CDs) for top and bottom MTJs. Similarly, an inverted MDMTJ design is known to offer better manufacturability and yield over more conventional structures.

While an MDMTJ design may offer high speed and high-efficiency, achieving high density combined with high-retention is challenging using this structure. To illustrate this, if an inverted structure is used for high-efficiency arrays with a 35 nm CD for a bottom MTJ and 100 nm CD for a top MTJ, to achieve a high-retention array, the following is needed: ~80 nm CD for the bottom MTJ, and ~250 nm CD for the top MTJ. This significantly reduces the magnetoresistive random access memory (MRAM) density (in this example, an MTJ pitch of ~500 nm is needed). However, if the top MTJ's CD is reduced for on-chip high-retention arrays, the tunneling magnetoresistance (TMR) will be diluted (decreased), which is not favorable (for minimal TMR dilution, typically a ten-times area increase or 3.1×CD increase is needed).

In order to address this, and in order to achieve a high density, various embodiments described in the present disclosure provide a way to achieve high-efficiency and high-retention arrays within the same stack, but without negatively impacting TMR. Various embodiments may have some or all of the following features: a) a structure and integration method that achieves on-chip arrays of high density, high-efficiency, and high-retention STT-MRAMs; b) all arrays share the same stack; c) the high-retention arrays have a larger bottom MTJ CD while the top barrier is shorted; d) this structure maintains high density for high-retention arrays without negatively impacting its TMR; and e) a novel process flow for this structure is provided without additional process complexity and similar stack for both arrays.

Figure 12:
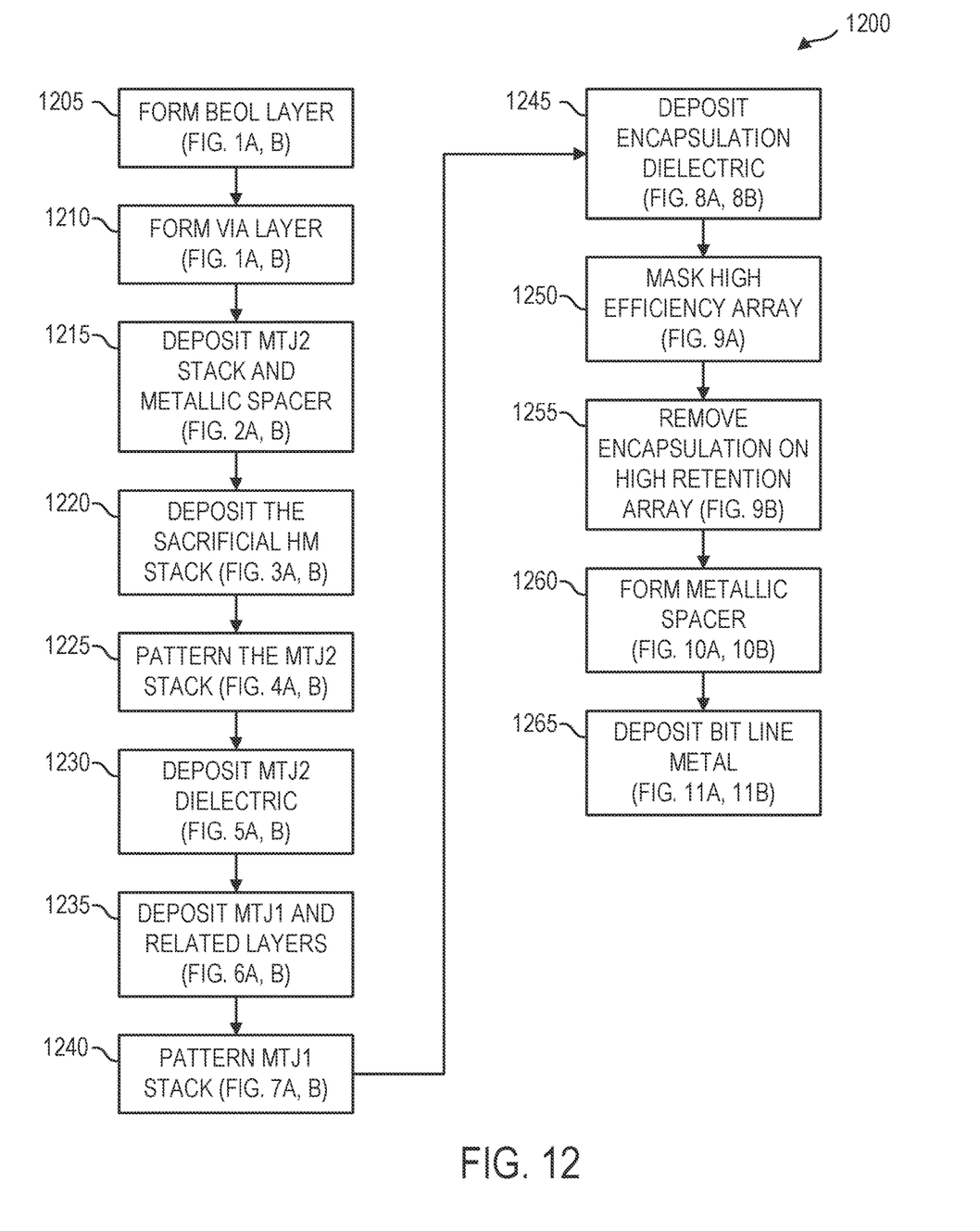
FIG. 12 is a flowchart for operations involved in manufacturing the high-efficiency and a high-retention inverted wide-base double magnetic tunnel junction device, according to some embodiments.

The present embodiments include DMJT structures and methods of fabricating DMTJ structures wherein a common stack shares both a high-efficiency array and a high-retention array. Cross-sectional Figures (FIGS. 1A through 11B) are provided showing the structures at different stages of the manufacturing method 1200, which is provided by a flowchart in FIG. 12. The flowchart of the method steps is discussed in conjunction with the cross-sectional diagrams. In some alternative implementations, the manufacturing steps in the flowcharts may occur in a different order that that which is noted in the Figures. Moreover, any of the layers depicted in the Figures may contain multiple sublayers.

Figure 1A:
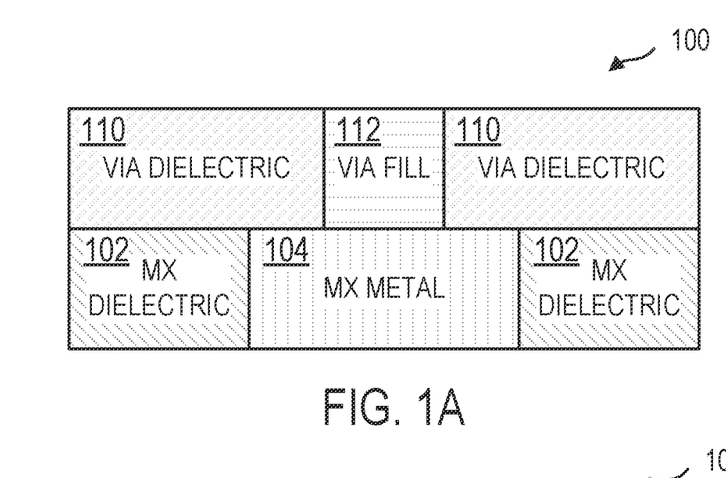
FIGS. 1A and 1B are cross-sectional views of certain base layers that are formed underneath a high-efficiency and a high-retention inverted wide-base high-efficiency and a high-retention inverted wide-base double magnetic tunnel junction device, according to some embodiments.
Figure 1B:
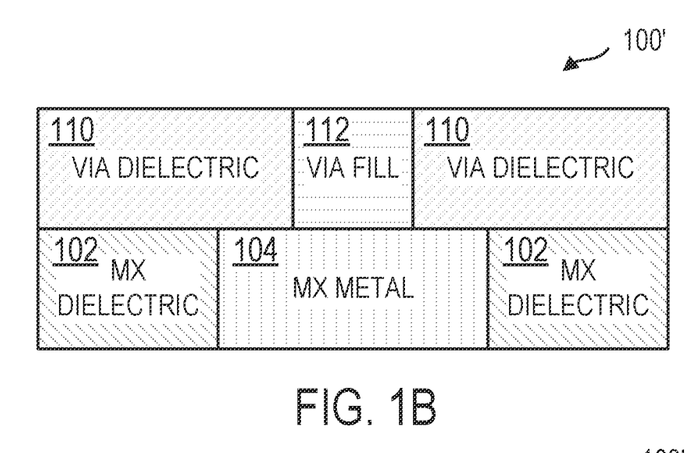

Referring now to the drawings in which like numerals represent the same or similar elements and initially to FIGS. 1A and 1B, an exemplary method of manufacturing a DMTJ stack to which the present embodiments may be applied is shown. In FIGS. 1A-11B, which are cross sections illustrated at different manufacturing steps, the FIG. numbers ending with an "A" illustrate embodiments of the high-efficiency array 100, and the FIG. numbers ending with a "B" illustrate embodiments of the high-retention array 100'. Also, in the "B" FIGS., structure reference numbers having a prime (or, for the sake of simplicity herein, an apostrophe) " " after the reference structures that differ from similar structures illustrated in the "A" FIGS. In the "B" FIGS., structure reference numbers not having a prime (or, for the sake of simplicity herein, an apostrophe) " " after the reference structures that are the same as corresponding data structures illustrated in the "A" FIGS.

In FIG. 1A, which is a cross sectional view of the stack, the creation of the high-efficiency array 100 begins, in operation 1205 (FIG. 12), with the formation of an $x^{th}$ level back end of line ("BEOL") layer 102, 104. In general, BEOL is the second portion of IC fabrication where the individual devices (transistors, capacitors, resistors, etc.) are interconnected with wiring on the wafer. As shown in FIG. 1A, a first BEOL layer includes a BEOL Mx dielectric layer 102 and a BEOL Mx metal layer 104. The Mx dielectric layer 102 may be comprised of, for example, $SiO_x$, $SiN_x$, SiBCN, low-κ NBLoK (a nitrogen-doped silicon carbide), or any other suitable dielectric material. The Mx metal layer 104 may include, for example, Cu, TaN, Ta, Ti, TiN or a combination thereof.

In operation 1210, a via layer may be formed above the Mx layer, which may comprise a via dielectric 110 portion and a via fill 112 portion. The via dielectric 110 portion may be deposited using, e.g., lithography and RIE. The via fill 112 portion may be filled with a metal containing, e.g., W, Cu, TaN, Ta, Ti, TiN, TiOCN, TaOCN, or some combination, using CVD, PVD, ALD or some combination and using CMP to planarize the surface. A similar process may be used as shown in FIG. 1B for the high-retention array 100'.

Figure 2A:
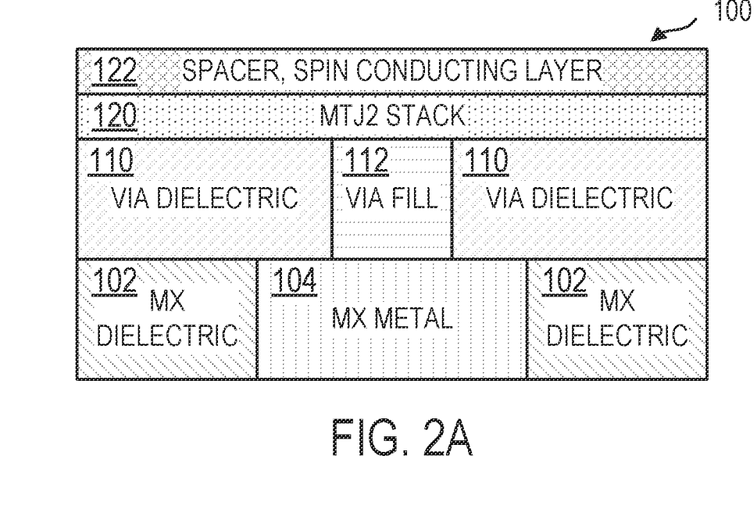
FIGS. 2A and 2B are cross-sectional views of the high-efficiency and a high-retention inverted wide-base double magnetic tunnel junction device of FIGS. 1A and 1B after additional fabrication operations, according to some embodiments.

FIG. 2A is a cross sectional view of the stack # that shows the result of operation 1215 for depositing an MTJ2 120, as well as a seed/metallic spacer layer and a spin conducting layer 122. (An MTJ1 stack that sits above this is described below.)

The MTJ2 120 has a reference (pinned) layer, a tunneling barrier, and a free layer which is on top of tunneling barrier (not shown). The MTJ1 has a reference layer and a tunnel barrier. The tunneling barrier may contain, e.g., MgO, AlO, and TiO, or materials of higher electrical tunnel conductance, while preserving spin polarization, such as semiconductors or low-bandgap insulators.

The magnetic reference layer has a fixed magnetization and can be composed of a metal or metal alloy (or a stack thereof) that includes one or more metals exhibiting high spin polarization at the tunnel barrier interface. It may include Fe, Ni, Co, Cr, B, or Mn. The magnetic reference layer may be a multilayer arrangement having: 1) a high spin polarization region formed of a metal and/or metal alloy using the metals mentioned above, and 2) a region constructed of a material or materials that exhibit strong perpendicular magnetic anisotropy (strong PMA). Example materials with a strong PMA that can be used include a metal such as Co, Ni, Pt, Pd, Ir, or Ru, and can be arranged as alternating layers. The strong PMA region can also include alloys that exhibit strong intrinsic or bulk (as opposed to interface) PMA, with exemplary alloys including Co—Fe—Tb, Co—Fe—Gd, Co—Cr—Pt, Co—Pt, Co—Pd, Fe—Pt, and/or Fe—Pd. The alloys can be arranged as alternating layers.

The free layer can be composed of a magnetic material (or a stack of magnetic materials) with a magnetization that can be changed in orientation relative to the magnetization orientation of the magnetic reference layer(s). Example magnetic materials for the magnetic free layer include alloys and/or multilayers of Co, Fe, and of Co—Fe, Ni, alloys of Ni—Fe, alloys of Co—Fe—B, Heusler compounds such as $Mn_xGe_y$, and $Al_xMn_yGe$.

The MTJ2 stack 120 is formed, followed by a spin-conducting layer 122, followed by a the MTJ1 stack 124. For the sake of simplicity and ease of understanding, not all of the layers of the MTJ stacks are shown in the figures. In certain embodiments, the MTJ stacks 120 and 124 each include a reference layer, a first tunnel barrier layer, a first free layer, a metal spacer layer, a second free layer, and a second tunnel barrier layer. It should be appreciated that the MTJ stack may include additional layers, omit certain layers, and each of the layers may include sublayers.

In general, with regard to the MTJ stacks, information is stored in the magnetic orientation of a free layer film (described in further detail herein) in relation to that of the reference layer. The reference layer may be a single layer or a plurality of layers. In an embodiment, the reference layer of the MTJ stack is a synthetic antiferromagnetic ("SAF") layer. In certain embodiments, the reference layer of the MTJ stack includes a plurality of sublayers (e.g., twenty or more sublayers).

Figure 2B:
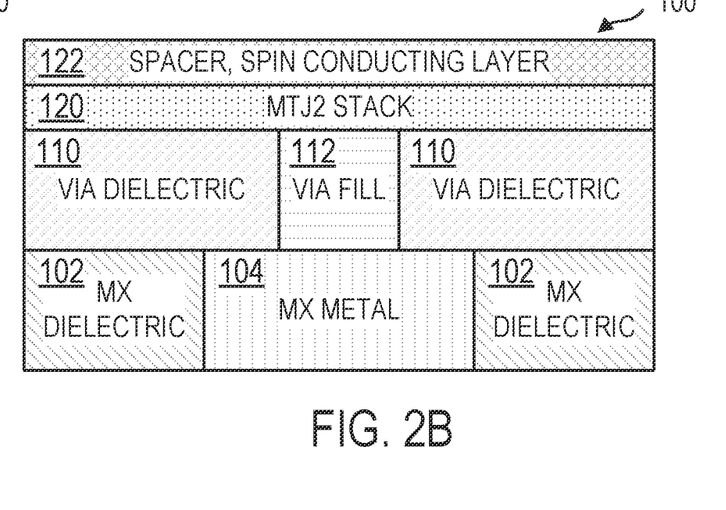

In formation of either of the MTJ stacks, a first tunnel barrier layer is formed on top of the reference layer. In an embodiment, the first tunnel barrier layer is a barrier, such as a thin insulating layer or electric potential, between two electrically conducting materials. Electrons (or quasiparticles) pass through the tunnel barrier by the process of quantum tunneling. In certain embodiments, the first tunnel barrier layer includes at least one sublayer composed of MgO. Materials other than MgO can be used to form the first tunnel barrier layer. The free layer is a magnetic free layer that is adjacent to the first tunnel barrier layer to be opposite the reference layer. The magnetic free layer has a magnetic moment or magnetization that can be flipped. The second tunnel barrier layer is formed on the free layer. In certain embodiments, the second tunnel barrier includes an outermost sublayer (or some other sublayer) comprised of the same material (e.g., MgO) as the first tunnel barrier layer. Either of the MTJ stacks 120 and 124 may include additional layers, omit certain layers, and each of the layers may include any number of sublayers. Moreover, the composition of layers and/or sublayers may be different between the the MTJ2 stack 120 and the the MTJ1 stack 124. In certain embodiments, the the MTJ2 stack 120 and the the MTJ1 stack 124 are formed by a self-aligned patterning process. However, in certain examples, the the MTJ2 stack 120 is not self-aligned with the the MTJ1 stack 124. A similar process may be used as shown in FIG. 2B for the high-retention array 100'.

Figure 3A:
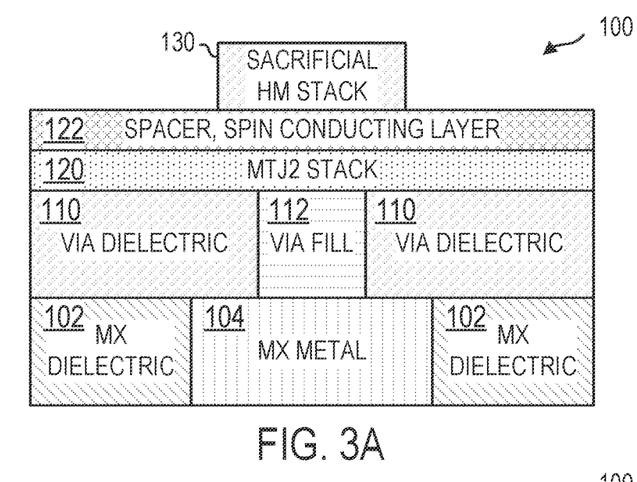
FIGS. 3A and 3B are cross-sectional views of the high-efficiency and a high-retention inverted wide-base double magnetic tunnel junction device of FIGS. 2A and 2B after additional fabrication operations, according to some embodiments.
Figure 3B:
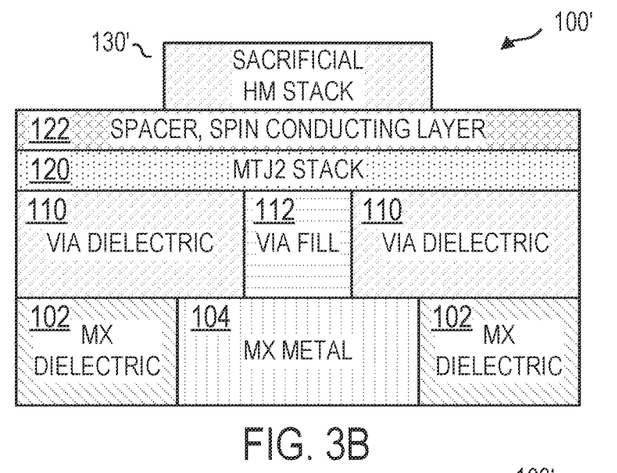

FIG. 3A is a cross sectional view of the stack # that shows the result of operation 1220 that deposits a sacrificial dielectric/organic hard mask (HM), also referred to herein as a sacrificial HM (SHM), stack 130, for the next layer, using, e.g., OPL, $SiN_x$, $SiO_x$, or photoresist. The SHM 130 may be patterned by using, e.g., lithography and RIE. Here the high-efficiency array 100 and the high-retention array 100' of FIG. 3B begin to differ. For the high-efficiency array 100 CD (HECD), a size of 35 nm may be typical (or, e.g., a range between 20-35 nm). For the high-retention array 100' CD (HRCD), a size of 80 nm may be typical (or, e.g., a range between 70-100 nm). This may reflect a CD ratio range (HECD:HRCD) of, for example, between 1:2 and 1:5. A typical MTJ pitch size may be between 150-200 nm. The MTJ pitch size may be scaled according to these dimensions to match other HECD and HRCD sizes.

Figure 4A:
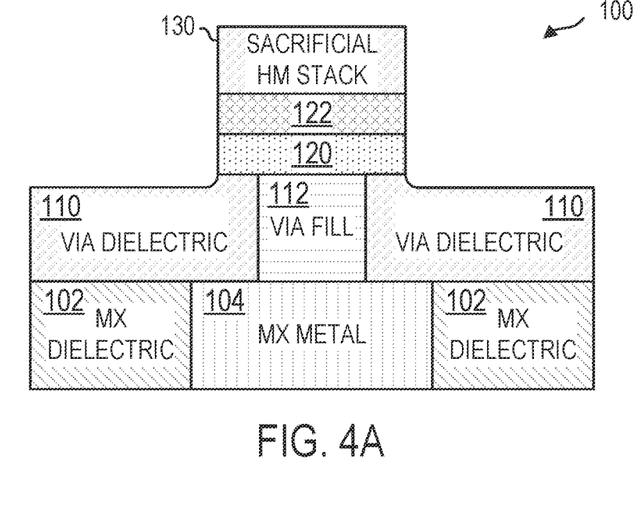
FIGS. 4A and 4B are cross-sectional views of the high-efficiency and a high-retention inverted wide-base double magnetic tunnel junction device of FIGS. 3A and 3B after additional fabrication operations, according to some embodiments.
Figure 4B:
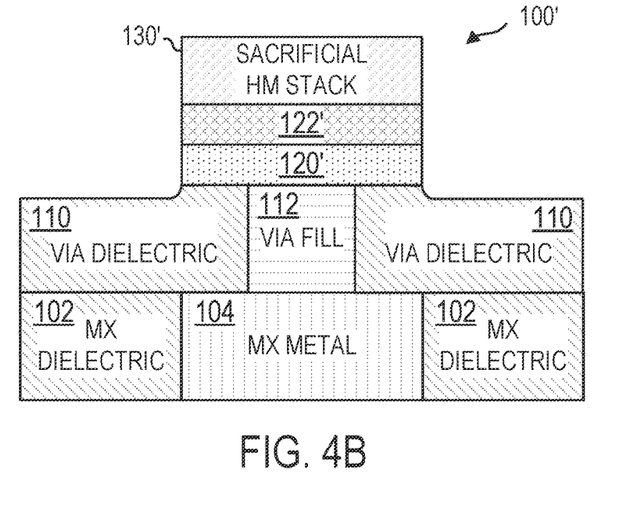

FIG. 4A is a cross sectional view of the stack # that shows the result of operation 1225 that patterns the MTJ2 120, 122 using, e.g., IBE, RIE, or some combination thereof for the high-efficiency array 100. The removal of material may stop inside (near the top) of the via dielectric layer 110, and operation 1225 may provide an optional air-break or controlled in-situ oxidation to remove partial shorts due to metallic redeposition. FIG. 4B shows the results of operation 1225 on the high-retention array 100' with similar results, other than the wider CD for the MTJ2 stack 120', the spin conducting layer stack 122', and the sacrificial HM stack 130'.

Figure 5A:
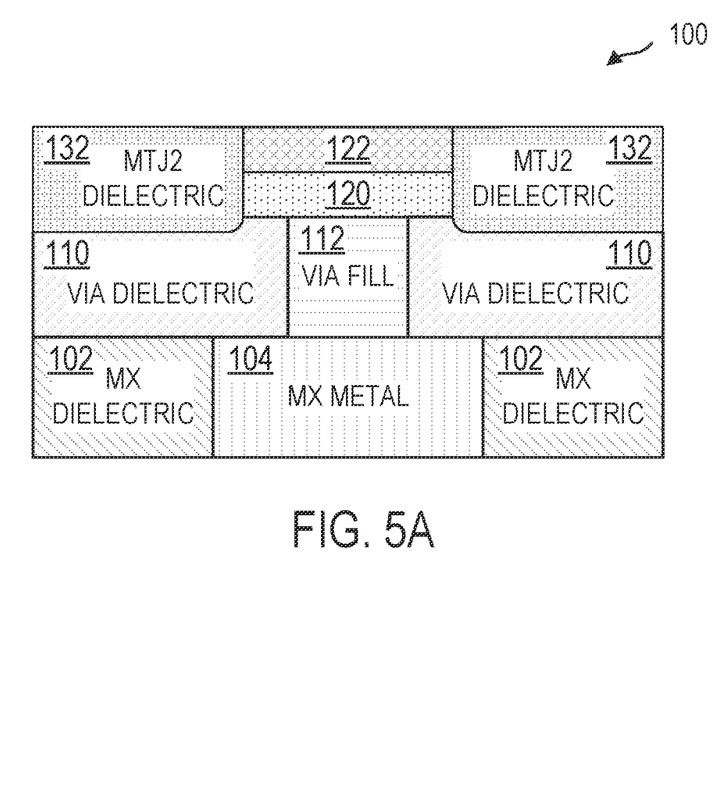
FIGS. 5A and 5B are cross-sectional views of the high-efficiency and a high-retention inverted wide-base double magnetic tunnel junction device of FIGS. 4A and 4B after additional fabrication operations, according to some embodiments.
Figure 5B:
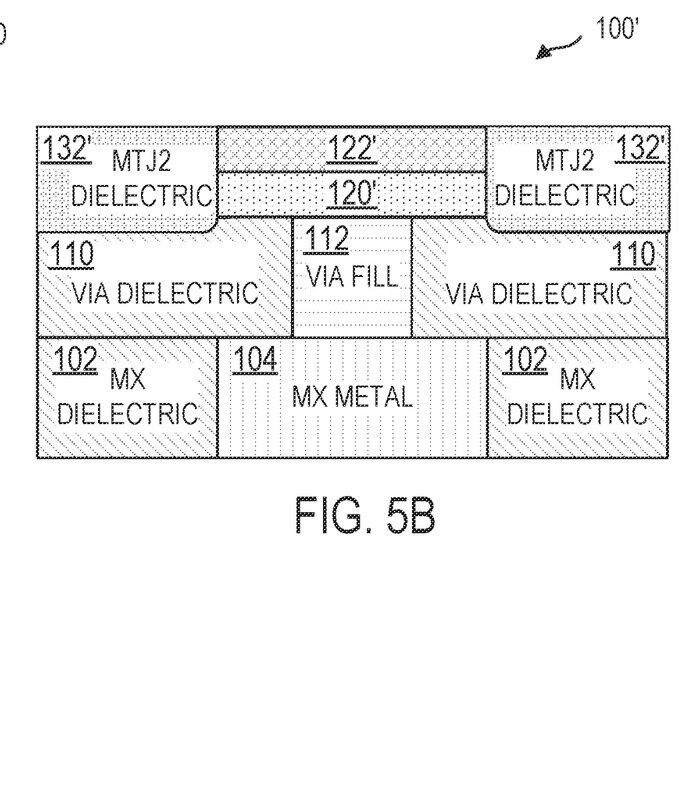

FIG. 5A is a cross sectional view of the stack # that shows the result of operation 1230 that deposits and CMPs an MTJ2 dielectric (such as SiN or SiBCN) layer 132, and stops even with the spin conducting layer 122. FIG. 5B shows the same process, but with the smaller MTJ2 dielectric layer 132'.

Figure 6A:
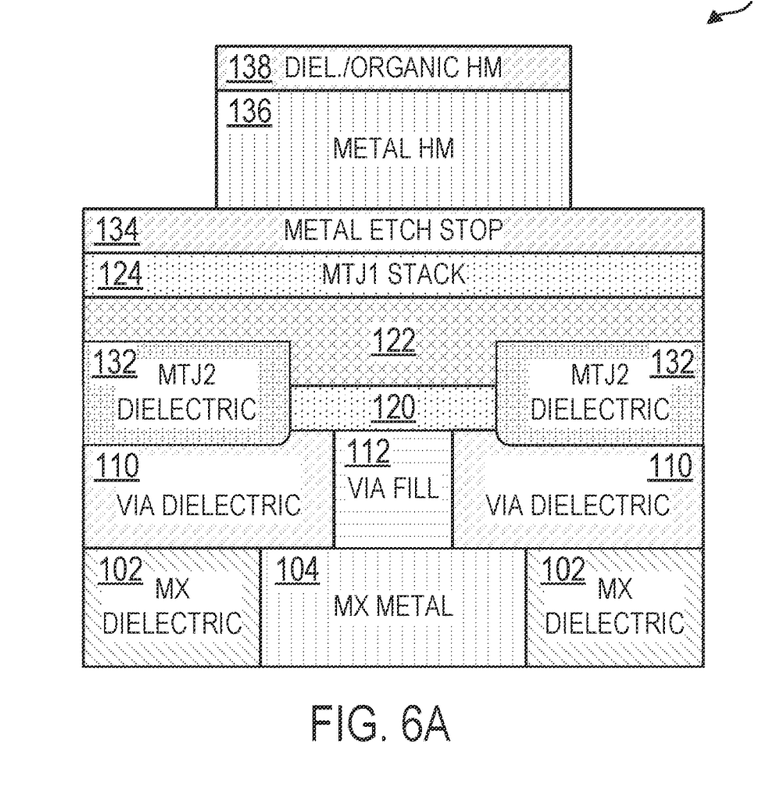
FIGS. 6A and 6B are cross-sectional views of the high-efficiency and a high-retention inverted wide-base double magnetic tunnel junction device of FIGS. 5A and 5B after additional fabrication operations, according to some embodiments.

FIG. 6A is a cross sectional view of the stack # that shows the result of operation 1235 in which the MTJ1 a second MTJ stack (MTJ1) 124 and related layers are deposited. In operation 1235, the surface is pre-sputter cleaned to remove native oxide, and then a further spin conducting layer 122 (a continuation of the existing spin conducting layer) is applied. Next, the MTJ1 124 is deposited, followed by an etch stop metal layer 134, which may be comprised of, e.g., Ru.

Figure 6B:
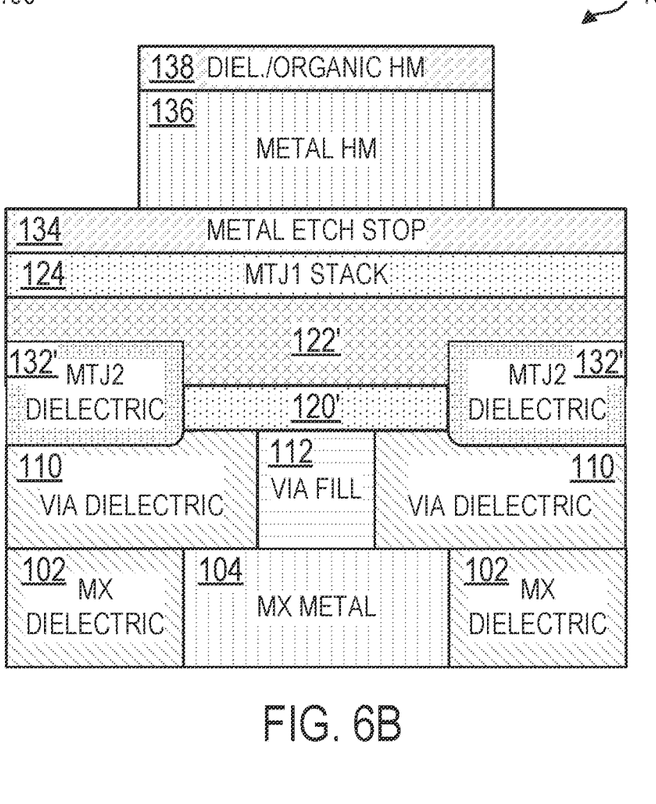

Next a top electrode metal HM layer 136 is deposited. This metal HM layer 136 may contain, e.g., W, TaN, and/or TiN, or any combination thereof. Above this, a dielectric/organic HM layer 138 may be added, and may comprise, e.g., OPL, $SiN_x$, $SiO_x$, and/or photoresist. The metal HM layer 136 and dielectric HM layer 138 may be patterned, e.g., by lithography and RIE. Here, the MTJ1 124 has a CD that is larger than the lower MTJ2 stack 120. For the high-efficiency array 100, a top CD value of ~100 nm may be typical, which is, e.g., 3.0-3.5× the CD of the bottom MTJ2 stack 120. For the high-retention array 100', as shown in FIG. 6B, a top CD of 80-100 nm may be typical. Additionally, the MTJ1 pitch size may be approximately 150-200 nm.

Figure 7A:
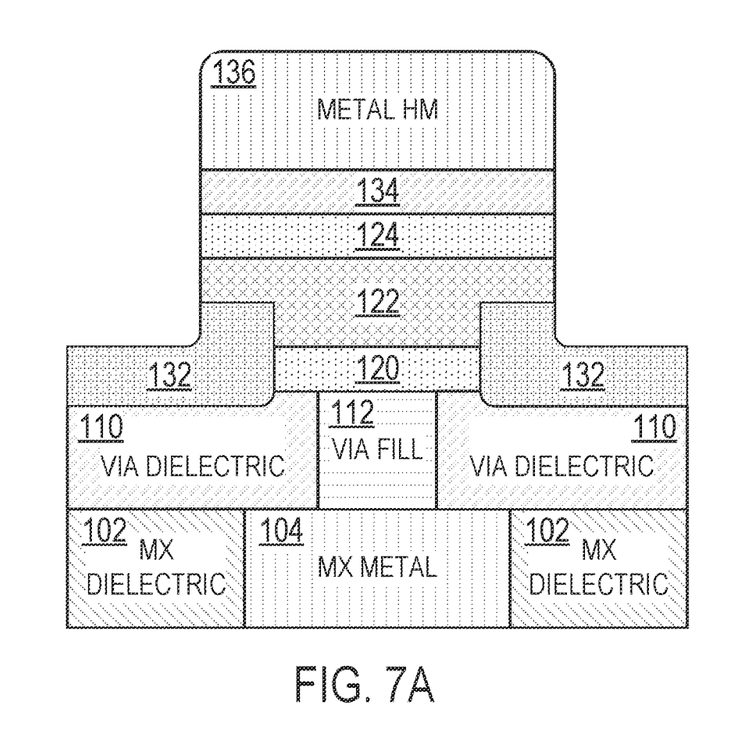
FIGS. 7A and 7B are cross-sectional views of the high-efficiency and a high-retention inverted wide-base double magnetic tunnel junction device of FIGS. 6A and 6B after additional fabrication operations, according to some embodiments.
Figure 7B:
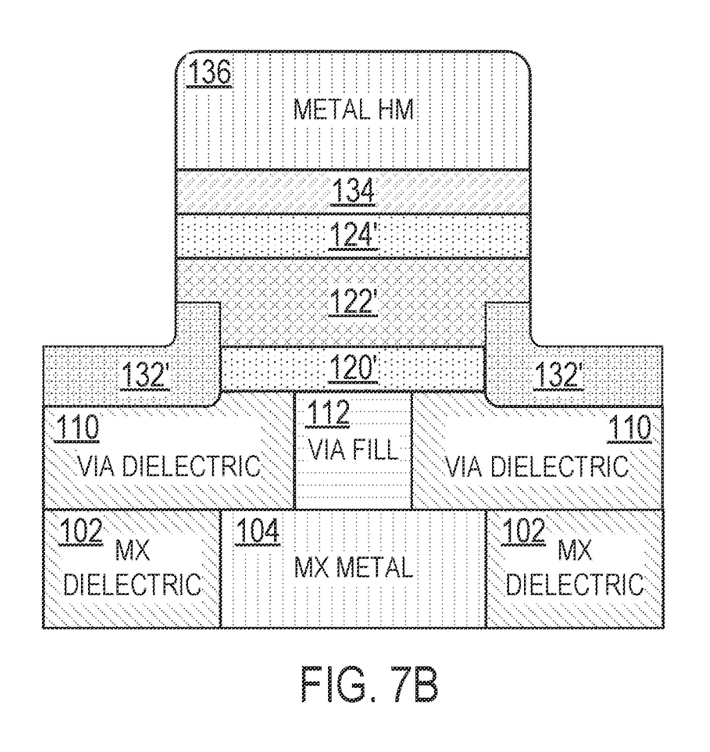

FIG. 7A is a cross sectional view of the stack that shows the result of operation 1240 in which the MTJ1 124 in the high-efficiency array 100 is patterned using at least one of IBE and RIE. The material removal is stopped inside (near the top) of the via dielectric layer 110. An optional air-break or a controlled in situ oxidation may be applied to avoid partial shorts due to metallic redeposition. A similar process is applied for the high-retention array 100' in FIG. 7B.

Figure 8A:
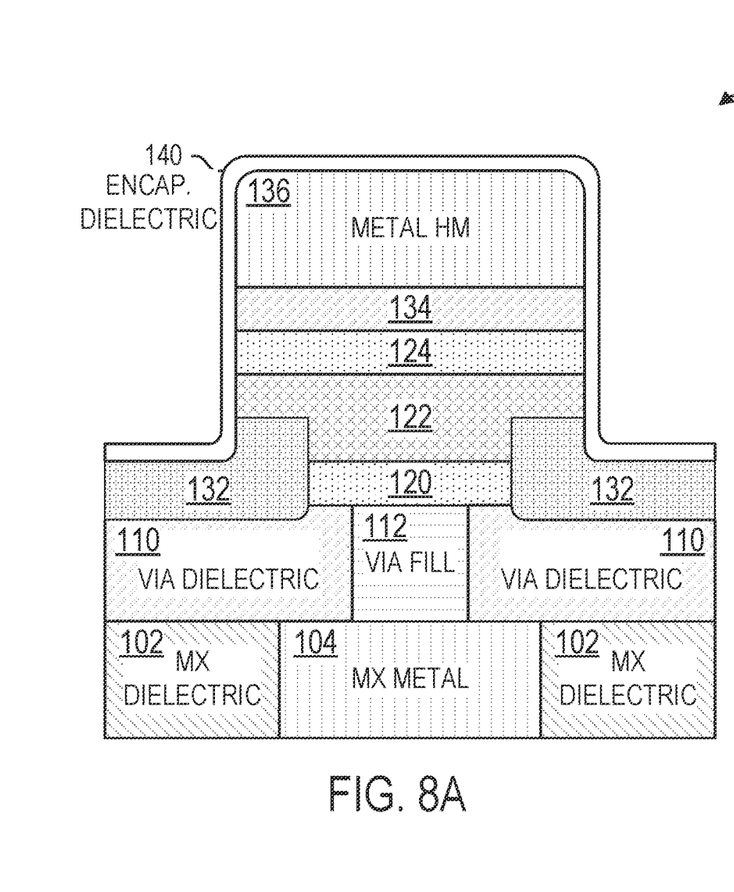
FIGS. 8A and 8B are cross-sectional views of the high-efficiency and a high-retention inverted wide-base double magnetic tunnel junction device of FIGS. 7A and 7B after additional fabrication operations, according to some embodiments.
Figure 8B:
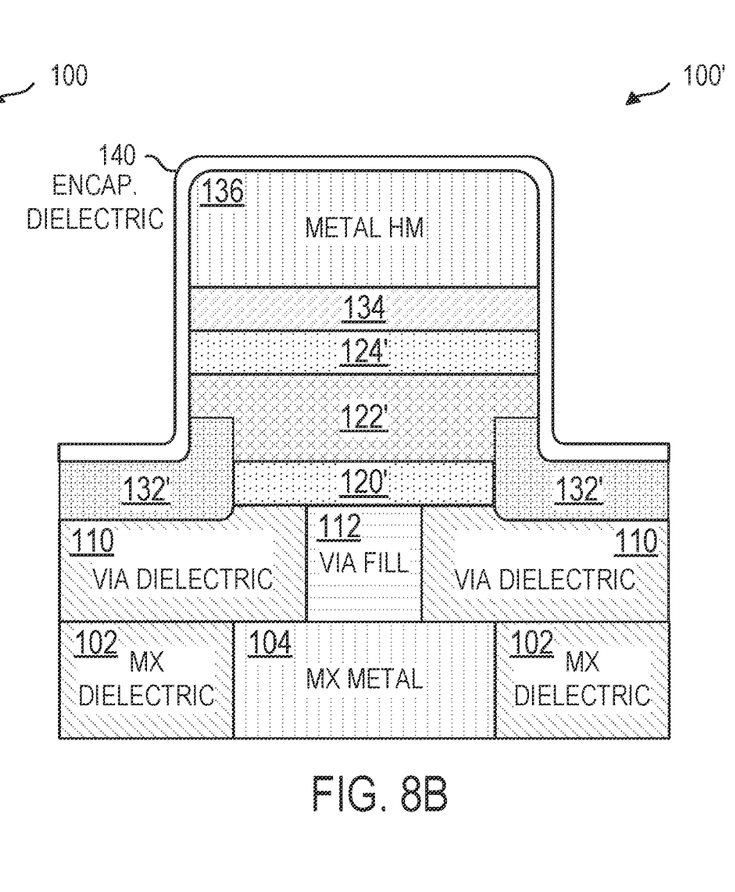

FIG. 8A is a cross sectional view of the stack that shows the result of operation 1245 in which an encapsulation dielectric layer 140 is applied for the high-efficiency array 100. An optional pre-treatment may be applied using, e.g., a plasma $O_2$, $H_2$, $N_2$, and/or $NH_3$ technique. The encapsulation dielectric may include $AlO_x$, $TiO_x$, $SiO_x$, BN, SiN or SiBCN, or any combination thereof, and may be applied using at least one of PVD, ALD or PECVD $AlO_x$, $TiO_x$, $SiO_x$, BN, SiN, or SiBCN. A similar process is applied for the high-retention array 100' in FIG. 8B.

Figure 9A:
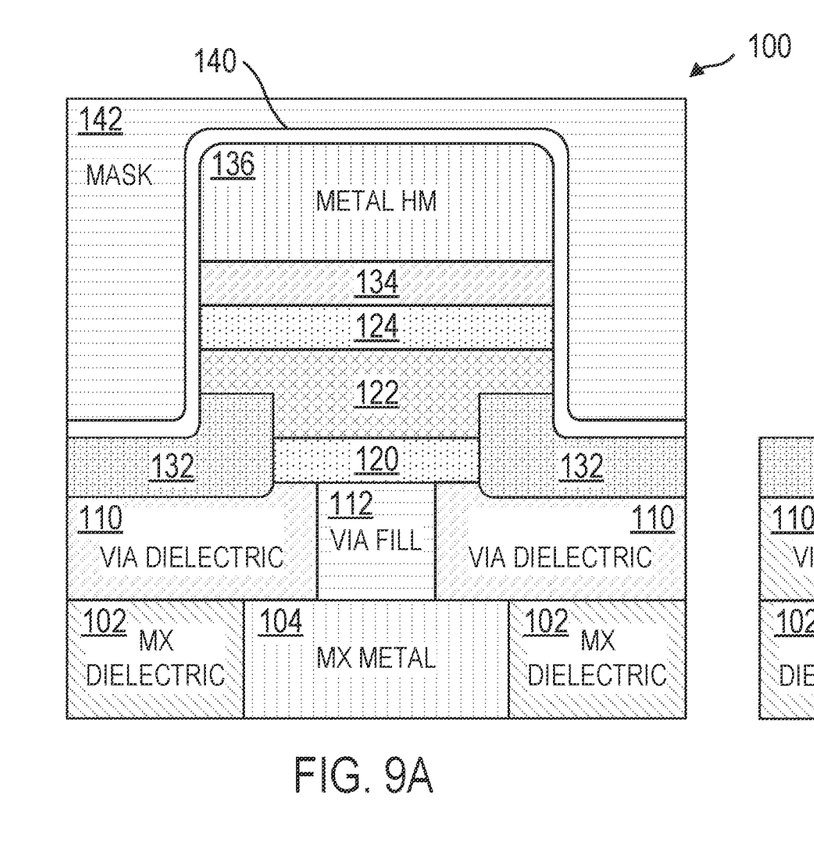
FIGS. 9A and 9B are cross-sectional views of the high-efficiency and a high-retention inverted wide-base double magnetic tunnel junction device of FIGS. 8A and 8B after additional fabrication operations, according to some embodiments.
Figure 9B:
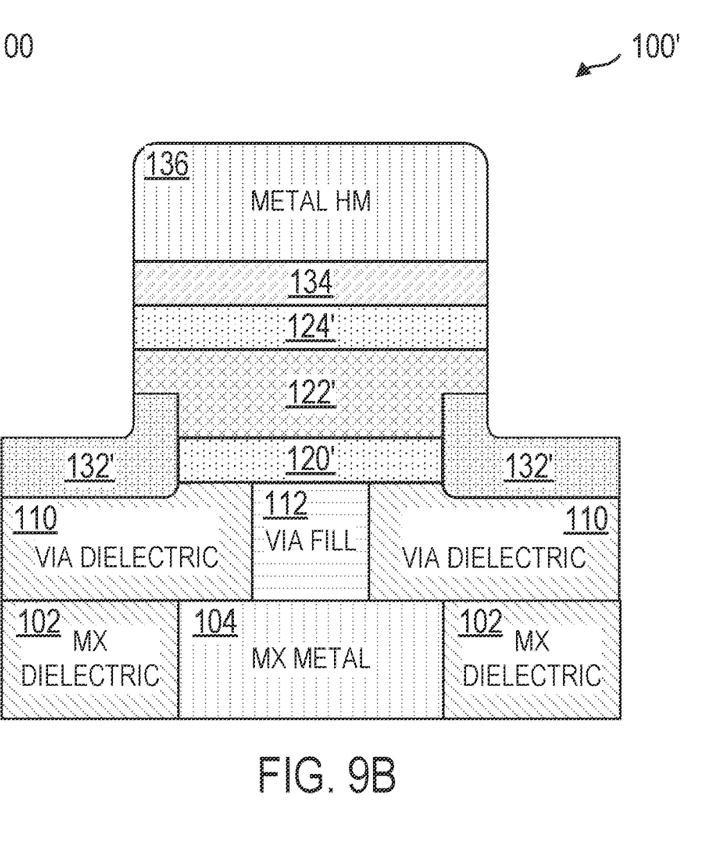

FIG. 9A is a cross sectional view of the stack that shows the result of operation 1250 in which a mask 142 is applied to the high-efficiency array 100 using, e.g., a resist or a spin-on-dielectric. FIG. 9B shows the result of operation 1255 in which the encapsulation 140 is removed from the high-retention array 100'. This may be achieved, e.g., using an RIE or a wet or IBE processes.

Figure 10A:
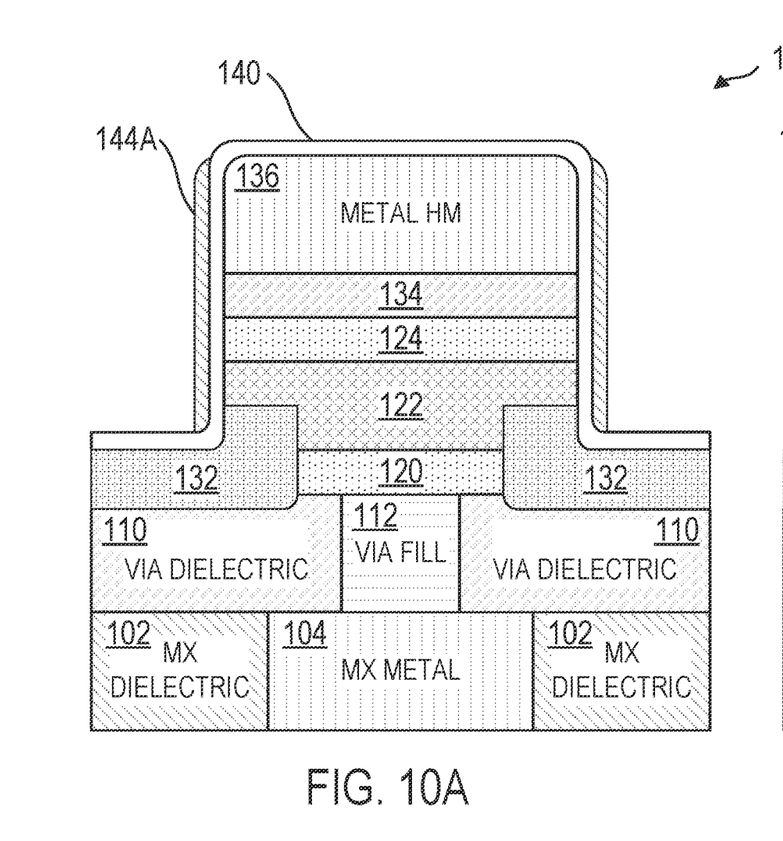
FIGS. 10A and 10B are cross-sectional views of the high-efficiency and a high-retention inverted wide-base double magnetic tunnel junction device of FIGS. 9A and 9B after additional fabrication operations, according to some embodiments.
Figure 10B:
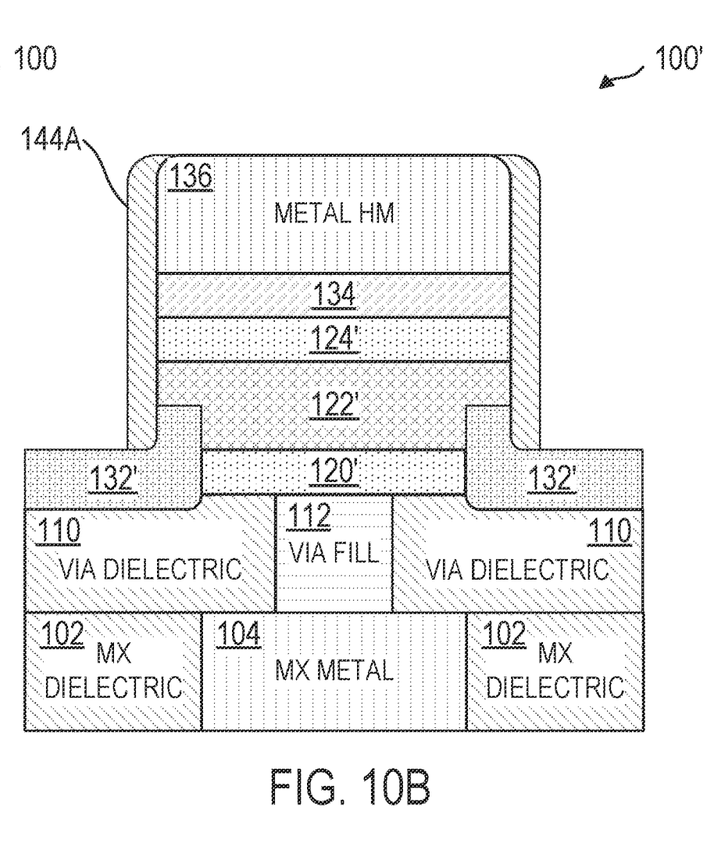

FIG. 10A is a cross sectional view of the stack that shows the result of operation 1260 on the high-efficiency array 100. The mask 142 has been stripped from the high-efficiency array 100. A metallic spacer 144A is formed on both the high-efficiency array 100 and the high-retention array 110' in FIG. 10B. The metallic spacer 144A may be made as, e.g., a TaN deposition by ALD and RIE). The purpose of the metallic spacer 144A is to short the high-retention array 100' top MTJ1 124'. The encapsulation dielectric 140 prevents this shorting on the high-efficiency array 100.

Figure 11A:
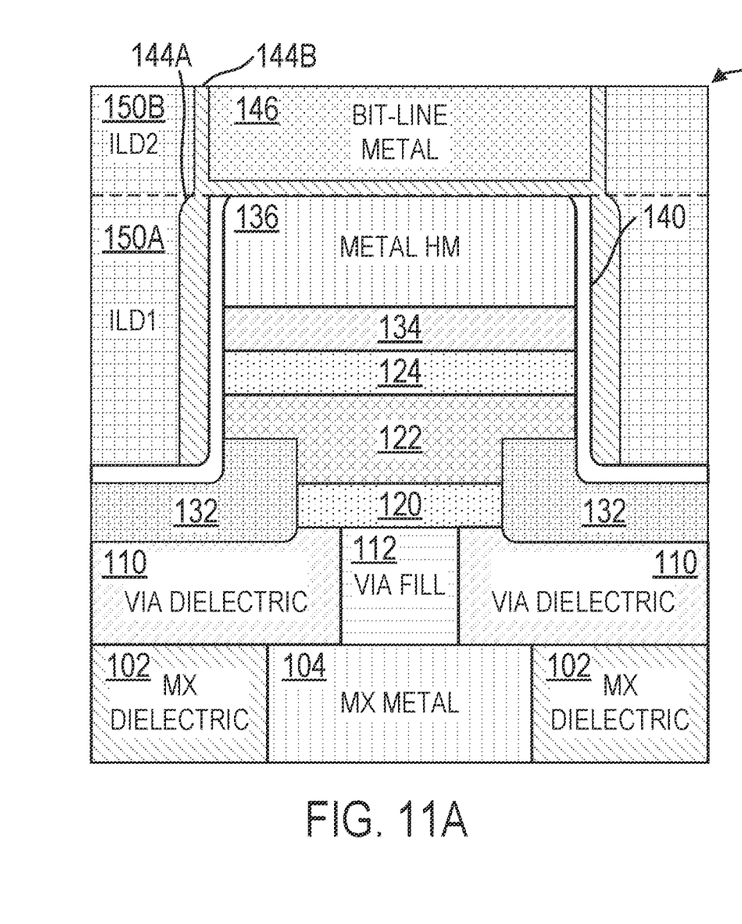
FIGS. 11A and 11B are cross-sectional views of the high-efficiency and a high-retention inverted wide-base double magnetic tunnel junction device of FIGS. 10A and 10B after additional fabrication operations, according to some embodiments.
Figure 11B:
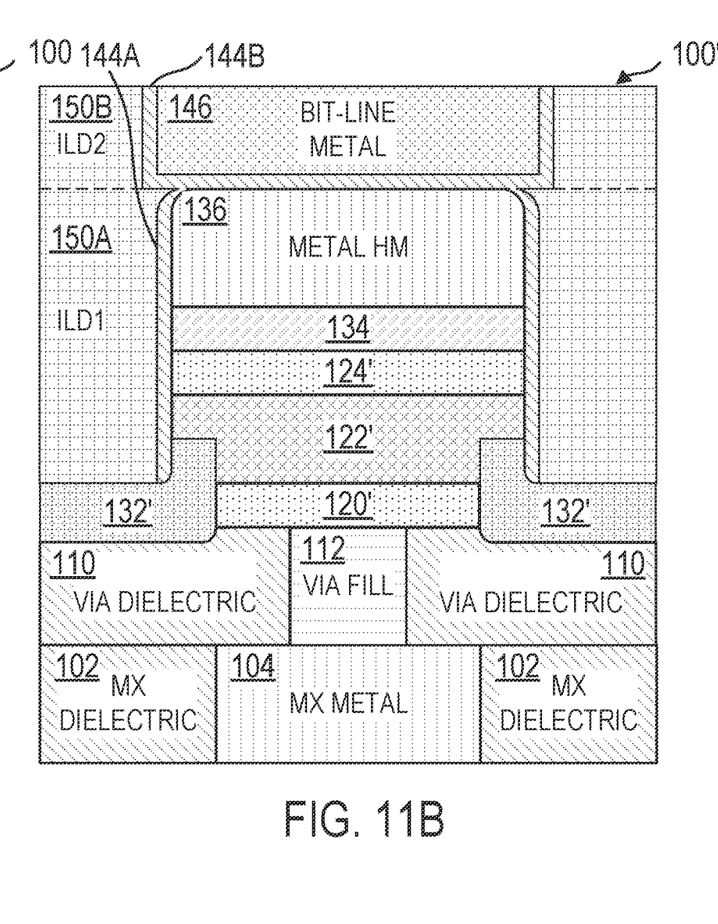

FIG. 11A is a cross sectional view of the stack that shows the result of operation 1265 on the high-efficiency array 100. A first interlayer dielectric (ILD1) 150A is deposited as encapsulation and spacer dielectrics and CMD is applied. Next, a second interlayer dielectric (ILD2) 150B is deposited. The ILD2 150B is then patterned using at least one of lithography or RIE, and the bit line 146 and fill liner 144B may be applied. The metal for the bit line may include one or a combination of TA, TaN, and Cu. A similar process produces the same result for the high-retention array 100' shown in FIG. 11B.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of manufacturing, on a common stack, a high-efficiency array and a high-retention array for an inverted wide-base double magnetic tunnel junction device, comprising:
   for the high-efficiency array and the high-retention array:
       forming a first magnetic tunnel junction stack (MTJ2);
       forming a spin conducting layer on the MTJ2; and
       forming a second magnetic tunnel junction stack (MTJ1) on the spin conducting layer;
   wherein:
       the first magnetic tunnel junction stack for the high-retention array has a high-retention critical dimension (CD) (HRCD) that is larger than a high-efficiency CD (HECD) of the first magnetic tunnel junction stack for the high-efficiency array; and
       the second magnetic tunnel junction stack (MTJ1) is shorted for the high-retention array and is not shorted for the high-efficiency array.

2. The method of claim 1, further comprising:
   providing a back end of line (BEOL) layer comprising an $M_x$ dielectric and an $M_x$ metal;

providing a via layer on top of the BEOL layer, the via layer comprising a via dielectric and a via fill;
wherein the MTJ2 is formed on top of the via layer.

3. The method of claim 2, wherein:
the $M_x$ dielectric comprises a material selected from the group consisting of $SiO_x$, $SiN_x$, SiBCN, and low-κ NBLoK;
the $M_x$ metal comprises a material selected from the group consisting of Cu, TaN, Ta, Ti, and TiN;
the via fill comprises a material selected from the group consisting of W, Cu, TaN, Ta, Ti, TiN, TiOCN, and TaOCN.

4. The method of claim 1, wherein:
the MTJ2 comprises a reference layer, a tunneling barrier layer formed on top of the reference layer, and a free layer on top of the tunneling barrier; and
the MTJ1 comprises a reference layer and a tunneling barrier layer.

5. The method of claim 1, wherein a ratio of the HECD:HRCD for the MTJ2 is between 1:2 and 1:5.

6. The method of claim 5, wherein:
the HECD for the MTJ2 is between 20-35 nm; and
the HRCD for the MTJ2 is between 70-100 nm.

7. The method of claim 6, wherein an MTJ1 pitch size and an MTJ2 pitch size are between-200 nm.

8. The method of claim 1, further comprising
providing a sacrificial hard mask (SHM) on the spin conducting layer;
forming the MTJ2 on the high-efficiency array to the HECD and the MTJ2 on the high-retention array to the HRCD;
providing an MTJ2 dielectric adjacent to the MTJ2 and the spin conducting layer; and
removing the SHM.

9. The method of claim 8, wherein:
the providing of the SHM uses a material selected from the group consisting of OPL, $SiN_x$, $SiO_x$, and photoresist, and is patterned using lithography and RIE;
the spin conducting layer and the MTJ2 are patterned using a technique selected from the group consisting of IBE and RIE; and
the MTJ2 dielectric comprises a material selected from the group consisting of SiN and SiBCN and stops even with the spin conducting layer.

10. The method of claim 8, wherein the spin conducting layer is partially on top of the MTJ2 and the MTJ2 dielectric.

11. The method of claim 1, further comprising:
forming an etch stop metal layer on the MTJ1;
forming a top electrode hard metal layer on top of the etch stop metal layer; and
forming a dielectric hard metal layer on top of the top electrode hard metal layer.

12. The method of claim 11, wherein:
the etch stop metal layer comprises Ru;
the top electrode hard metal layer comprises a material selected from the group consisting of W, TaN, and TiN; and
the dielectric hard metal layer comprises a material selected from the group consisting of OPL, $SiN_x$, $SiO_x$, and photoresist.

13. The method of claim 11, wherein the top electrode hard metal layer and the dielectric hard metal layer are patterned by lithography and RIE.

14. The method of claim 13, further comprising adding an encapsulation dielectric layer on top of the top electrode hard metal layer and the MTJ2 dielectric, and on the sides of the spin conducting layer, the MTJ1, and the etch stop metal layer for the high-efficiency array and the high-retention array.

15. The method of claim 14, further comprising:
adding a mask on top of the encapsulation dielectric layer for the high-efficiency array, but not the high-retention array; and
removing the encapsulation dielectric layer for the high-retention array, but not the high-efficiency array.

16. The method of claim 15, further comprising:
adding a metallic spacerA to a side of the encapsulation dielectric layer for the high-efficiency array, to side of the MTJ2 dielectric, sides of the spin conducting layer, sides of the MTJ1, such that the MTJ1 is shorted;
adding an additional metallic spacerB to a top of the electrode hard metal layer;
adding a bit line to the top of the additional metallic spacerB and providing the additional metal spacerB to sides of the bit line; and
adding an interlayer dielectricA, B to sides of the metallic spacerA and the additional metallic spacerB.

17. The method of claim 1, wherein the HECD for the MTJ1 is 3.0-3.5 times the HECD for the MTJ2.

18. The method of claim 17, wherein the HECD for the MTJ1 has a value of nm, and the HRCD for the MTJ1 has a range between 80-100 nm.

19. A magnetic tunnel junction device, comprising, on a common base:
a high-efficiency array, comprising:
a first magnetic tunnel junction stack (MTJ2);
a spin conducting layer on the MTJ2; and
a second magnetic tunnel junction stack (MTJ1) on the spin conducting layer; and
a high-retention array comprising:
a first magnetic tunnel junction stack MTJ2;
a spin conducting layer on the MTJ2; and
a second magnetic tunnel junction stack MTJ1 on the spin conducting layer;
wherein:
the first magnetic tunnel junction stack for the high-retention array has a high-retention critical dimension (CD) (HRCD) that is larger than a high-efficiency CD (HECD) of the first magnetic tunnel junction stack for the high-efficiency array; and
the second magnetic tunnel junction stack (MTJ1) is shorted for the high-retention array and is not shorted for the high-efficiency array.

20. A magnetic tunnel junction device, comprising:
a back end of line (BEOL) layer comprising an $M_x$ dielectric and an $M_x$ metal;
a via layer on top of the BEOL layer, the via layer comprising a via dielectric and a via fill, wherein the BEOL layer and the via layer form a common base;
a high-efficiency array formed on the common base, comprising:
a first magnetic tunnel junction stack MTJ2 that is formed on top of the via layer;
a spin conducting layer on the MTJ2;
a second magnetic tunnel junction stack MTJ1 on the spin conducting layer;
an etch stop metal layer on top of the MTJ1;
a top electrode hard metal layer on top of the etch stop metal layer;
an encapsulation dielectric layer on sides of spin conducting layer, the MTJ1, the etch stop metal layer, and the top electrode hard metal layer;

a metallic spacerA that is adjacent to the encapsulation dielectric layer;

an additional metallic spacerB to a top of the top electrode hard metal layer; and a bit line on top of the additional metallic spacerB; and a high-retention array formed on the common base, comprising:

a first magnetic tunnel junction stack MTJ2 that is formed on top of the via layer;

a spin conducting layer on the MTJ2;

a second magnetic tunnel junction stack MTJ1 on the spin conducting layer;

an etch stop metal layer on top of the MTJ1;

a top electrode hard metal layer on top of the etch stop metal layer;

a metallic spacerA that is adjacent to sides of spin conducting layer, the MTJ1, the etch stop metal layer, and the top electrode hard metal layer;

an additional metallic spacerB to a top of the top electrode hard metal layer; and a bit line on top of the additional metallic spacerB; and wherein:

the first magnetic tunnel junction stack for the high-retention array has a high-retention critical dimension (CD) (HRCD) that is larger than a high-efficiency CD (HECD) of the first magnetic tunnel junction stack for the high-efficiency array; and the second magnetic tunnel junction stack (MTJ1) is shorted for the high-retention array and is not shorted for the high-efficiency array.

* * * * *